US005179301A

United States Patent [19]

Hughes

[11] Patent Number: 5,179,301

[45] Date of Patent: Jan. 12, 1993

[54] SWITCHED CURRENT DIFFERENTIATOR CIRCUIT FOR DIFFERENTIATING AN INPUT SIGNAL IN THE FORM OF A SAMPLED ANALOG CURRENT

[75] Inventor: John B. Hughes, Sussex, England

[73] Assignee: U.S. Philips Corporation, New York, N.Y.

[21] Appl. No.: 574,622

[22] Filed: Aug. 28, 1990

[30] Foreign Application Priority Data

Sep. 6, 1989 [GB] United Kingdom ................ 8920126

[51] Int. Cl.[5] ......................... G06K 7/12; H03K 3/01; G06G 7/18; G05F 3/16

[52] U.S. Cl. .................................... 307/490; 307/498; 307/270; 307/353; 328/127; 323/315

[58] Field of Search ............... 307/490, 497, 498, 270, 307/529, 352, 353; 328/142, 127, 172; 377/57

[56] References Cited

U.S. PATENT DOCUMENTS 3,809,923 5/1974 Esser .................................... 377/57
4,897,596 1/1990 Hughes et al. ...................... 323/315
5,028,822 7/1991 Hughes .............................. 307/353
5,055,719 10/1991 Hughes .............................. 307/491

FOREIGN PATENT DOCUMENTS 0372647 6/1990 European Pat. Off. .

OTHER PUBLICATIONS

Wu et al, "The Design of High-Pass and Band-Pass Ladder Filters Using Novel SC Differentiators", IEEE 1989, pp. 1463-1466.
Hughes et al, "Switched Currents—A New Technique for Analog Sampled-Data Signal Processing", IEEE 1989, pp. 1584-1587.

*Primary Examiner*—Stanley D. Miller
*Assistant Examiner*—Trong Phan
*Attorney, Agent, or Firm*—Bernard Franzblau

[57] ABSTRACT

A differentiator circuit for sampled analog input currents comprises a first current memory cell including a capacitor (C2), a switch (S2), a transistor (T2) and a transistor (T3) and a second current memory cell including a capacitor (C1), a switch (S1) and a transistor (T1). During one portion ($\phi$1) of each sampling period the input current (i) minus the current produced by the transistor (T1), which acts as a current source when switch (S1) is open, together with appropriate bias currents to allow bi-directional input currents to be handled, is fed via a switch (S3) to the first current memory cell. During another portion ($\phi$2) of each sampling period the input current plus an appropriate bias current is fed to the input of the second current memory cell. The switches (S3) and (S2) are open so transistor (T2) acts as a current source providing an output via switch (S4) at an output (17) in addition to the output (15). The differentiated output signal is available throughout at output (15) but only during the other portion ($\phi$2) of each sampling period at output (17). The circuit corresponds to a backward Euler mapping from continuous time ideal differentiators. Corresponding circuits giving foward Euler and bilinear mappings are also disclosed as are circuits for lossy differentiators. Various alternative current memory cells are disclosed.

25 Claims, 7 Drawing Sheets

SWITCHED CURRENT DIFFERENTIATOR CIRCUIT FOR DIFFERENTIATING AN INPUT SIGNAL IN THE FORM OF A SAMPLED ANALOG CURRENT

This invention relates to a differentiator circuit for differentiating an input signal in the form of a sampled analog current.

Differentiator circuits for continuous signals as opposed to sampled signals are well known and may comprise merely a series capacitor and shunt resistor or the resistor may form a feedback path for an operational amplifier. Neither form is particularly convenient for implementation in integrated form, i.e. as a part of an integrated circuit.

Differentiator circuits using switched capacitor techniques were disclosed by Chung-Yu Wu and Tsai-Chung Yu in "The Design of High-Pass and Band-Pass Ladder Filters using Novel SC Differentiators", IEEE International Symposium on Circuits and Systems, 1989, pp 1463–1466. Both Forward Euler and Backward Euler mappings from the continuous time differentiator are shown and their application to filter design is given.

It is an object of the invention to produce suitable building blocks for constructing filters using switched current techniques.

Switched current techniques have been disclosed by J. B. Hughes, N. C. Bird, I. C. Macbeth in "Switched Currents—A New Technique for Analog Sampled-Data Signal Processing" IEEE International Symposium on Circuits and Systems, 1989, pp. 1584–1587.

SUMMARY OF THE INVENTION

The invention provides a differentiator circuit for differentiating an input signal in the form of a sampled analog current, comprising first and second current memory cells each having an input for receiving a current to be stored and an output for reproducing the stored current, means for applying a current which comprises the input signal minus the output current of the second current memory cell to the input of the first current memory cell during one portion of each sampling period, means for applying the input signal to the input of the second current memory cell during another portion of each sampling period, and means for deriving the differentiated output signal from the output of the first current memory cell.

This provides a simple implementation of the function of signal differentiation in switched current circuits and enables the construction of filters using differentiator circuits.

A differentiator circuit for differentiating signals in the form of bi-directional currents may comprise means for adding a bias current to the input current to enable a unidirectional current to be applied to the inputs of the first and second current memory cells, and means for subtracting a bias current from the output of the second current memory cell during one portion of the sampling period for application to the input of the first current memory cell wherein the means for deriving the differentiated output signal comprises means for subtracting an appropriately scaled bias current from an output current produced by the first current memory cell.

This enables bi-directional currents to be processed using current memory cells which are only capable of handling unidirectional currents. Bi-directional currents can be applied to the differentiator input and bi-directional currents can be made available at the differentiator output. The bias currents, which may be produced by constant current sources, can be contained within a module forming the differentiator and not propagated between modules. This reduces problems associated with matching of current sources across large areas of integrated circuit substrates.

The differentiator may comprise means for subtracting a current proportional to the differentiator output current from the input signal applied to the first and/or second current memory cells. This enables the construction of differentiators which perform either a forward Euler or bilinear mapping from the continuous time differentiator and the construction of lossy differentiators depending on which current memory cell the signal proportional to the output current is subtracted from.

The current proportional to the differentiator output current may be subtracted from the input signal only during one portion of each sampling period. This construction enables bilinear ideal and lossy backward and forward Euler differentiators to be implemented.

The current proportional to the differentiator output current may be inverted with respect to the differentiator output current. By this means the output signal can be subtracted from the input signal allowing a forward Euler mapping from the continuous time differentiator to be achieved.

The current memory cells may comprise sensing means for sensing an input current, storage means for storing the input current and reproducing means for reproducing the input current wherein the sensing and reproducing means comprise the same device(s). This eliminates errors caused by device mismatching enabling a more accurate processing of the signal currents to be achieved.

The current memory cells may comprise a field effect transistor having a switch connected between its gate and drain electrodes, the field effect transistor acting as the sensing means when the switch is closed and the reproducing means when the switch is open, wherein the storage means comprises the gate-source capacitance of the field effect transistor. This enables the construction of a current memory which can be conveniently integrated using MOS technology in large scale integrated circuits.

A further capacitor may be connected between the gate and source electrodes of the transistor. This may reduce the effects of charge feed through from the switches enabling a more accurate reproduction of the sensed current, but has the disadvantage of using a greater area in integrated forms and may involve additional process steps.

The first and/or second current memory cell may comprise a second cascode connected field effect transistor connected between the drain electrode of the first transistor and the switch. This provides a higher output impedance when the first transistor is acting as a current source, that is when the switch is open.

The first current memory cell may comprise a plurality of outputs each producing a current dependent on the current stored. In this way a number of scaled outputs can be obtained which can be independently scaled and separate from any output current fed back to the input of the first and/or second current memory cells.

BRIEF DESCRIPTION OF THE DRAWING

Embodiments of the invention will now be described, by way of example, with reference to the accompanying drawings, in which.

DESCRIPTION OF THE PREFERRED EMBODIMENTS

Figure 1:
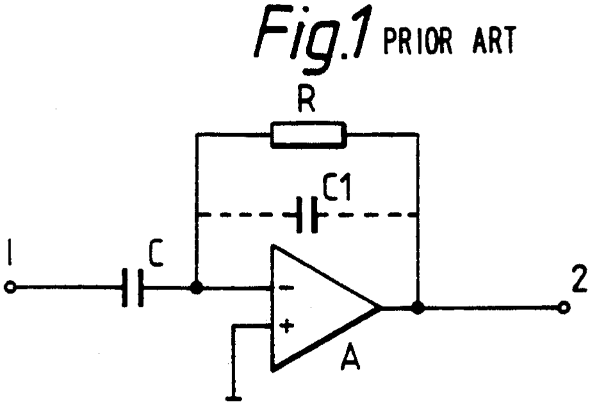
Fig.1 PRIOR ART
FIG. 1 shows a known continuous time differentiator circuit.

FIG. 1 shows a known differentiator circuit having an input 1 which is connected via a capacitor C to the inverting input of a differential amplifier A. A resistor R is connected between the inverting input and the output of the amplifier A while the non-inverting input of amplifier A is connected to ground. The output of amplifier A is connected to the output 2 of the differentiator circuit. As is well known to persons skilled in the art, the transfer function of the differentiator circuit shown in FIG. 1 is given by $$H(s) = -sCR \qquad (1)$$

Figure 2:
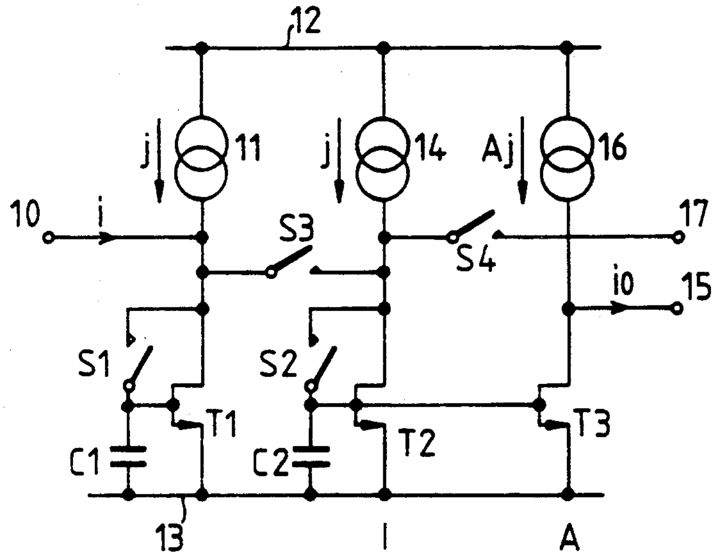
FIG. 2 is a circuit diagram of a first embodiment of a differentiator circuit according to the invention.

FIG. 2 shows a first embodiment of a differentiator circuit according to the invention using switched current techniques which has an input 10 which is connected to the junction of a current source 11 and the drain electrode of an n-channel field effect transistor T1. The other end of the current source 11 is connected to a positive supply rail 12 while the source electrode of transistor T1 is connected to a negative supply rail 13. A switch S1 is connected between the drain and gate electrodes of transistor T1 while a capacitor C1 is connected between its gate and source electrodes. A switch S3 is connected between the drain electrode of transistor T1 and the junction of a current source 14 and the drain electrode of a n-channel field effect transistor T2. The other end of the current source 14 is connected to the positive supply rail 12 while the source electrode of transistor T2 is connected to the negative supply rail 13. A switch S2 is connected between the drain and gate electrodes of transistor T2 while a capacitor C2 is connected between its gate and source electrodes. The gate electrode of transistor T2 is connected to the gate electrode of an n-channel field effect transistor T3. The source electrode of transistor T3 is connected to the negative supply rail 13 while its drain electrode is connected to an output 15 and via a current source 16 to the positive supply rail 12. The drain electrode of transistor T2 is also connected via a switch S4 to a second output 17.

Figure 3:
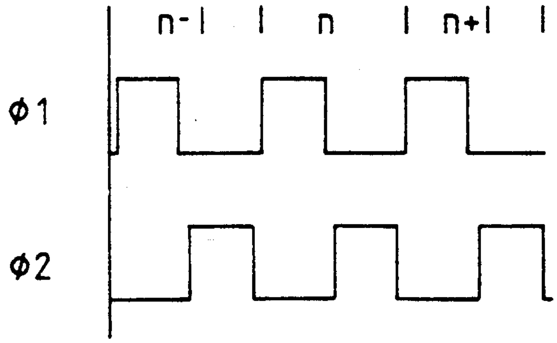
FIG. 3 shows waveforms of clock signals used to operate switches in the embodiments of the invention shown in FIG. 2 and FIGS. 4 to 10.

The current sources 11 and 14 each produce a current j while the current source 16 produces a current A.j. The channel width/length ratio of transistor T3 is A times that of transistor T2. Switches S2 and S3 are closed during the portion $\phi 1$ of each sampling period (see FIG. 3) while switches S1 and S4 are closed during portion $\phi 2$ of each sampling period. The current sources allow a bidirectional input current i to be applied to input 10 without reverse biasing the input transistor T1 or T2 and a bidirectional output current $i_0$ to be produced at output 15.

The operation of the circuit can be analysed as follows. During the portion $\phi 2$ of a sampling period $(n-1)$, the current $I_1$ through transistor T1 is given by:

$$I_1 = j + i(n-1)$$

During the portion $\phi 1$ of a sampling period n, the current $I_2$ through transistor T2 is given by:

$$\begin{aligned} I_2 &= 2j + i(n) - I_1 \\ &= j + i(n) - i(n-1) \\ \text{Also } I_3 &= AI_2 \end{aligned}$$

where: $I_3$ is the current through transistor T3 and $$\begin{aligned} i_o(n) &= Aj - I_3 \\ i_o(n) &= Aj - A(j + i(n) - i(n-1)) \\ &= -A(i(n) - i(n-1)) \end{aligned}$$

Transforming to the z domain $$H(z) = \frac{i_o(z)}{i(z)} = -A(1 - z^{-1})$$

This corresponds to a Backward Euler mapping i.e.

$$S \rightarrow \frac{1}{T} \cdot (1 - z^{-1})$$

from equation (1) where T is the clock frequency and $A = CR/T$.

The differentiator circuit shown in FIG. 2 thus comprises a first current memory cell comprising capacitor C2, switch S2, transistor T2 and transistor T3 and a second current memory cell comprising capacitor C1, switch S1 and transistor T1. During one portion $\phi_9$ of each sampling period, the input current i minus the current produced by transistor T1, which acts as a current source when switch S1 is open, together with appropriate bias currents to allow bi-directional input currents to be handled, is fed via switch S3 to the first current memory cell. During another portion $\phi 2$ of each sampling period the input current plus an appropriate bias current is fed to the input of the second current memory cell. The switched S3 and S2 are open so transistor T2 acts as a current source giving an output via switch S4 at output 17 in addition to the output 15. The differentiated output signal is available throughout at output 15 but only during the portion $\phi 2$ of each sampling period at output 17.

Figure 4:
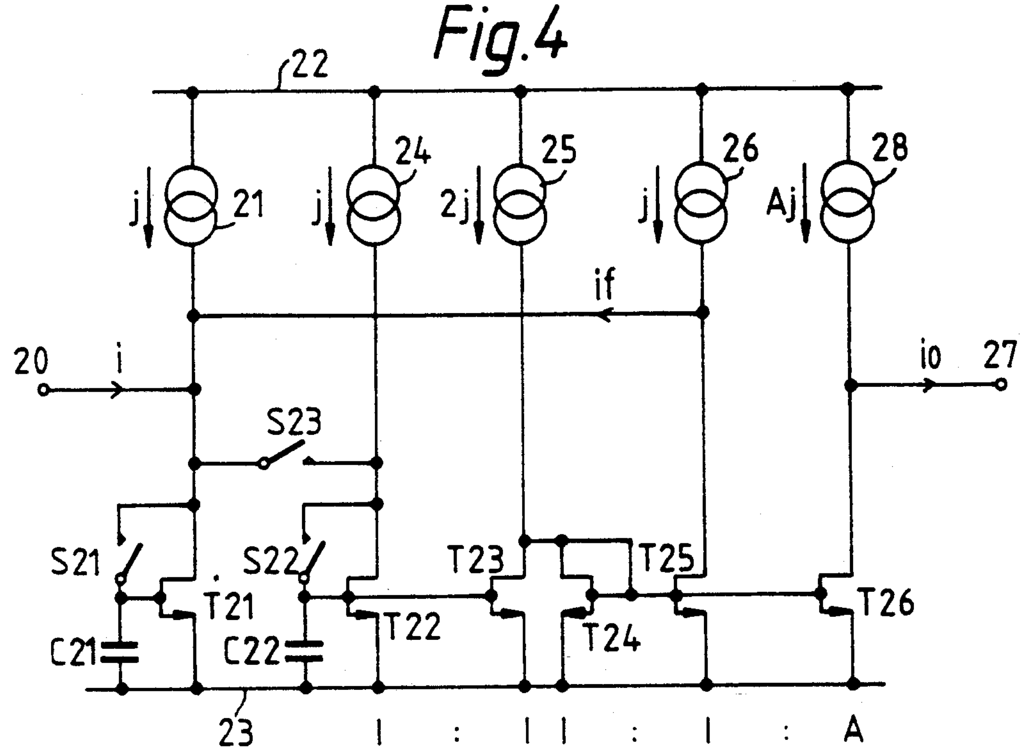
FIG. 4 is a circuit diagram of a second embodiment of a differentiator circuit according to the invention.

FIG. 4 shows a second embodiment of a differentiator circuit according to the invention which has an input 20 which is connected to the junction of a current source 21 and the drain electrode of an n-channel field effect transistor T21. The other side of the current source 21 is connected to a positive supply rail 22 while the source electrode of transistor T21 is connected to a negative supply rail 23. A switch S21 is connected between the gate and drain electrodes of transistor T21 while a capacitor C21 is connected between its gate and source electrodes. A current source 24 is connected between the positive supply rail 22 and the drain electrode of an n-channel field effect transistor T22 whose source electrode is connected to the negative supply rail 23. A switch S22 is connected between the gate and drain electrodes of transistor T22 while a capacitor C22 is connected between its gate and source electrodes.

The gate electrode of transistor T22 is connected to the gate electrode of an n-channel field effect transistor T23 whose source electrode is connected to the negative supply rail 23 and whose drain electrode is connected to the positive supply rail 22 via a current source 25. The drain electrode of transistor T23 is connected to the drain and gate electrodes of an n-channel field effect transistor T24 whose source electrode is connected to the negative supply rail 23. The gate electrode of transistor T24 is connected to the gate electrode of an n-channel field effect transistor T25 whose source electrode is connected to the negative supply rail 23 and whose drain electrode is connected, via a current source 26, to the positive supply rail 22. The gate electrode of transistor T25 is connected to the gate electrode of an n-channel field effect transistor T26 whose source electrode is connected to the negative supply rail 23 and whose drain electrode is connected to an output terminal 27 and via a current source 28 to the positive supply rail 22. The drain electrode of transistor T21 is connected to the drain electrode of transistor T25 and via a switch S23 to the drain electrode of transistor T22.

Transistors T22 and T23 are constructed to have equal channel width/length ratios so that they form a unity ratio current mirror circuit. Transistors T24 and T25 also form a unity ratio current mirror circuit but transistor T26 is constructed so that it carries A times the current through transistor T24. The current sources 21, 24 and 26 are arranged to produce a current j while current source 25 produces a current 2j and current source 28 produces a current Aj. Switches S22 and S23 are closed during portion $\phi 1$ of each sampling period while switch S21 is closed during portion $\phi 2$ of each sampling period.

The operation of the circuit can be analysed as follows. During the portion $\phi 2$ of a sampling period $n-1$, the current $I_1$ through transistor T21 is given by:

$$I_1 = J + i(n-1) + i_o(n-1)/A$$

where:

i is the input current and $i_o$ is the output current.

During the portion $\phi 1$ of a sampling period n, the current $I_2$ through transistor T22 is given by:

$$\begin{aligned} I_2 &= 2j + i(n) + i_o(n)/A - I_1 \\ &= 2j + i(n) + i_o(n)/A - j - i(n-1) - i_o(n-1)/A \\ &= j + i(n) - i(n-1) + (i_o(n) - i_o(n-1))/A \end{aligned}$$

Also $$i_o(n) = Aj - I_6 = Aj - AI_5 = Aj - AI_4 = Aj - A(2j - I_3)$$

where: $I_3$, $I_4$, $I_5$, $I_6$ are the currents through transistors T23, T24, T25 and T26, respectively $$\begin{aligned} i_o(n) &= -Aj + AI_3 \\ &= -Aj + AI_2 \\ &= -Aj + A(j + i(n) - i(n-1) + \\ &\quad (i_o(n) - i_o(n-1))/A) \\ i_o(n-1) &= A(i(n) - i(n-1)) \end{aligned}$$

Transforming to the z domain $$i_o(z)\, z^{-1} = A\, i(z)(1 - z^{-1})$$

$$H(z) = \frac{i_o(z)}{i(z)} = A(1 - z^{-1})/z^{-1}$$

This corresponds to a Forward Euler mapping $$s \rightarrow \frac{1}{T}\ \frac{z^{-1}}{1 - z^{-1}}$$

from equation (1) where: T is the clock frequency and $A = CR/T$. It should be noted that this circuit is non-inverting while the Backward Euler version is inverting. This may be useful when combining the two circuits in bi-quadratic filter sections.

Figure 5:
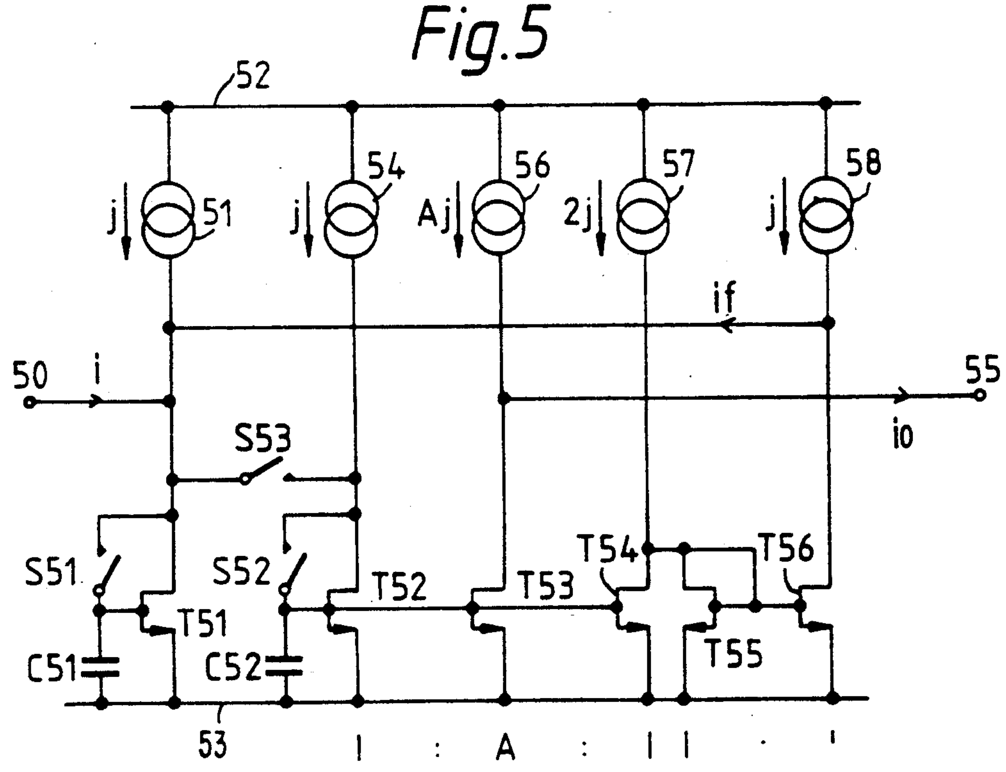
FIG. 5 is a circuit diagram of a third embodiment of a differentiator circuit according to the invention.

A third embodiment of a differentiator circuit according to the invention in the form of an inverting differentiator circuit is shown in FIG. 5 which comprises an input 50 which is connected to the junction of a current source 51 and the drain electrode of an n-channel field effect transistor T51. The other end of the current source 51 is connected to a positive supply rail 52 while the source electrode of transistor T51 is connected to a negative supply rail 53. A switch S51 is connected between the drain and gate electrodes of transistor T51 while a capacitor C51 is connected between its gate and source electrodes. The drain electrode of transistor T51 is connected, via a switch S53, to the junction of a current source 54 and the drain electrode of an n-channel field effect transistor T52. The other end of the current source 54 is connected to the positive supply rail 52 while the source electrode of transistor T52 is connected to the negative supply rail 53. A switch S52 is connected between the drain and gate electrodes of transistor T52 while a capacitor C52 is connected between its source and gate electrodes. The gate electrode of transistor T52 is connected to the gate electrodes of two further n-channel field effect transistors T53 and T54. The source electrode of transistor T53 is connected to the negative supply rail 53 while its drain electrode is connected to an output 55 and, via a current source 56, to the positive supply rail 52. The source electrode of transistor T54 is connected to the negative supply rail 53 while its drain electrode is connected to the drain and gate electrodes of an n-channel field effect transistor T55 and, via a current source 57, to the positive supply rail 52. The source electrode of transistor T55 is connected to the negative supply rail 53 while its gate electrode is connected to the gate electrode of an n-channel field effect transistor T56. The source electrode of transistor T56 is connected to the negative supply rail 53 while its drain electrode is connected to the drain electrode of transistor T51 and, via a current source 58, to the positive supply rail 52.

The current mirror circuit formed by transistors T52, T53 and T54 is arranged to have current ratios of 1:A:1 while the current mirror circuit formed by transistors T55 and T56 is arranged to have a current ratio of 1:1. The current sources 51, 54, 56, 57 and 58 are arranged to produce the currents j, j, Aj, 2j, and j, respectively. Switches S52 and S53 are closed during the portion $\phi 1$ of each sampling period while switch S51 is closed during portion $\phi 2$ of each sampling period. For the following analysis of the operation of this circuit, the currents $I_1$, $I_2$, $I_3$, $I_4$, $I_5$ and $I_6$ are defined as those flowing in transistors T51, T52, T53, T54, T55 and T56, respectively, while the current $i_f$ is that flowing in the connection between the drain electrodes of transistors T51 and T56. The applied input current is i and the output current is $i_o$.

During portion $\phi 2$ of sampling period n−1

$$I_1 = i(n-1) + j + i_f(n-1)$$

$$i_f = j - I_6 = j - I_5$$

$$I_5 = 2j - I_4 = 2j - I_3/A$$

$$I_3 = Aj - i_o$$

Consequently $$I_5 = j + i_o/A$$

and $$i_f = -i_o/A$$

So $$i_f(n-1) = -i_o(n-1)/A$$

Therefore $$I_1 = j + i(n-1) - i_o(n-1)/A$$

During portion $\phi 1$ of sampling period n $$\begin{aligned} I_2 &= i(n) + 2j + i_f(n) - I_1 \\ &= I_3/A \end{aligned}$$

Therefore $$j - i_o(n)/A = 2j + i(n) - i_o(n)/A - j - i(n-1) - i_o(n-1)/A$$
$$i_o(n-1) = -A(i(n) - i(n-1))$$
$$i_o(z)\, z^{-1} = -A\, i(z)(1 - z^{-1})$$

$$H(z) = \frac{i_o(z)}{i(z)} = \frac{-A(1 - z^{-1})}{z^{-1}}$$

which corresponds to a Forward Euler mapping $$s \rightarrow \frac{1}{T}\ \frac{z^{-1}}{1 - z^{-1}}$$

from equation (1) where: T is the sampling period and $A = CR/T$.

Figure 6:
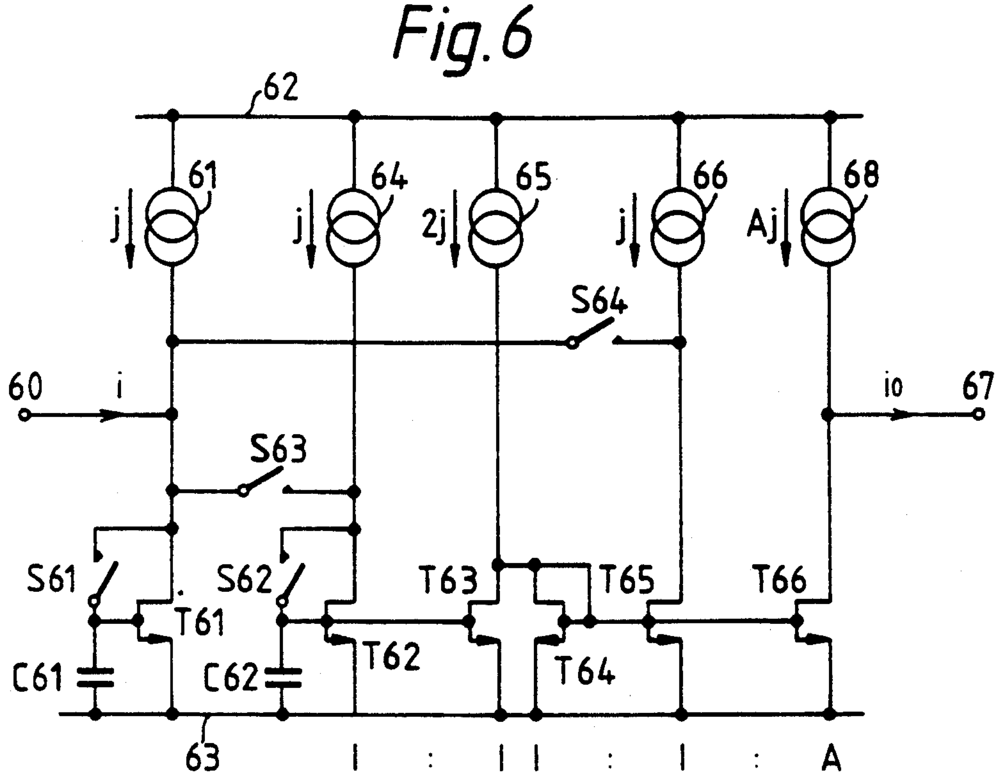
FIG. 6 is a circuit diagram of a fourth embodiment of a differentiator circuit according to the invention.

FIG. 6 shows a fourth embodiment of a differentiator circuit according to the invention in the form of a bilinear differentiator which comprises an input 60 which is connected to the junction of a current source 61 and the drain electrode of an n-channel field effect transistor T61. The other end of the current source 61 is connected to a positive supply rail 62 while the source electrode of transistor T61 is connected to a negative supply rail 63. A switch S61 is connected between the drain and gate electrodes of transistor T61 while a capacitor C61 is connected between its gate and source electrodes. The drain electrode of transistor T61 is connected via a switch S63 to the junction of a current source 64 and the drain electrode of an n-channel field effect transistor T62. The other end of the current source 64 is connected to the positive supply rail 62 while the source electrode of transistor T62 is connected to the negative supply rail 63. A switch S62 is connected between the drain and gate electrodes of transistor T62 while a capacitor C62 is connected between its gate and source electrodes. The gate electrode of transistor T62 is connected to the gate electrode of an n-channel field effect transistor T63 whose source electrode is connected to the negative supply rail 63 and whose drain electrode is connected to the positive supply rail 62 via a current source 65. The drain electrode of transistor T63 is connected to the drain and gate electrodes of an n-channel field effect transistor T64 whose source electrode is connected to the negative supply rail 63. The gate electrode of transistor T64 is connected to the gate electrodes of two further n-channel field effect transistors T65 and T66 whose source electrodes are connected to the negative supply rail 63. The drain electrode of transistor T65 is connected to the positive supply rail 62 via a current source 66 and to the drain electrode of transistor T61 via a switch S64. The drain electrode of transistor T66 is connected to an output 67 and, via a current source 68, to the positive supply rail 62.

In operation an input current i is fed to input 60 and an output current $i_o$ becomes available from output 67. The switches S62 and S63 are closed during the portion $\phi 1$ of each sampling period while the switches S61 and S64 are closed during the portion $\phi 2$ of each sampling period. The current sources 61, 64, 65, 66 and 68 produce the currents j, j, 2j, j, and Aj, respectively. The current mirror circuit formed by transistors T62 and T63 has a current ratio of 1:1 while the current mirror circuit formed by transistors T64, T65 and T66 has current ratios of 1:1:A.

The operation of the integrator shown in FIG. 6 can be analysed as follows. During the portion $\phi 2$ of sampling period (n−1) the current $I_1$ through transistor T61 is given by the expression:

$$I_1 = j + i(n-1) + i_o(n-1)/A$$

During the portion $\phi 1$ of sampling period n, the current $I_2$ through transistor T62 is given by the expression:

$$\begin{aligned} I_2 &= 2j + i(n) - I_1 \\ &= 2j + i(n) - (j + i(n-1) + i_o(n-1)/A) \\ &= j + i(n) - i(n-1) - i_o(n-1)/A \end{aligned}$$

-continued $$i_o(n) = Aj - I_6 = A(j - I_5) = A(j - I_4) = Aj - A(2j - I_3)$$
$$= -Aj + AI_3 = -Aj + A \cdot I_2$$

Therefore $$I_2 = j + i_o(n)/A, \text{ and}$$

$$j + i_o(n)/A = j + i(n) - i(n-1) - i_o(n-1)/A$$

$$i_o(n) + i_o(n-1) = A(i(n) - i(n-1))$$

Transforming to the z domain $$i_o(z)(1 + z^{-1}) = Ai(z)(1 - z^{-1})$$

$$H(z) = \frac{i_o(z)}{i(z)} = A \cdot \frac{(1 - z^{-1})}{1 + z^{-1}}$$

which corresponds to a bilinear mapping to the z domain $$s \rightarrow \frac{2}{T} \frac{1 - z^{-1}}{1 + z^{-1}}$$

of the continuous time differentiator function H(s)=sCR where $A = 2CR/T$

Figure 7:
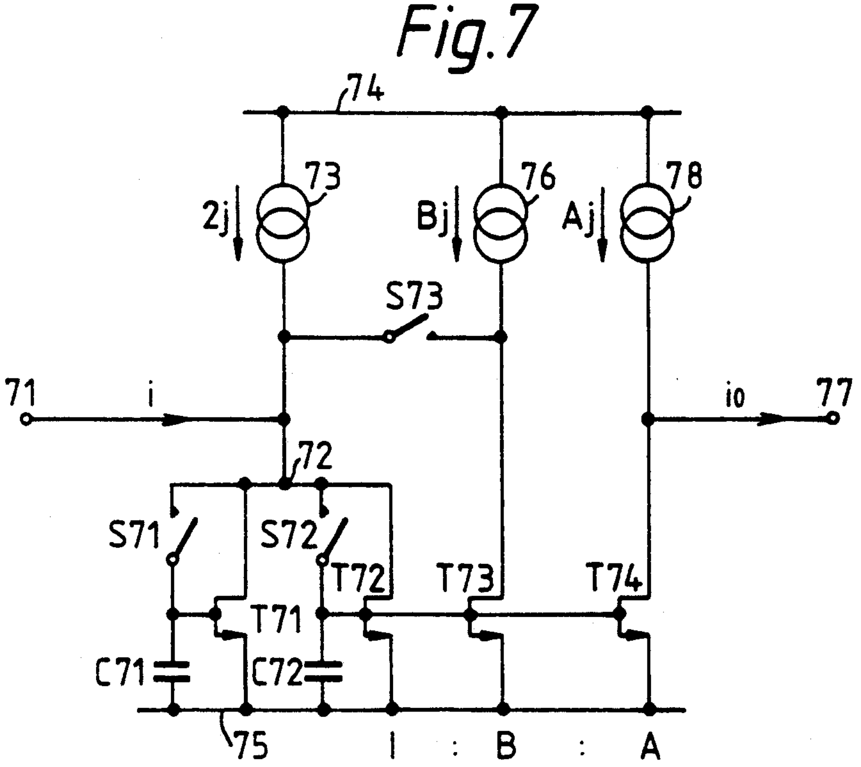
FIG. 7 is a circuit diagram of a fifth embodiment of a differentiator circuit according to the invention.

FIG. 7 shows a fifth embodiment of a differentiator circuit according to the invention in the form of a lossy differentiator performing a Backward Euler mapping from a continuous time lossy differentiator. As shown in FIG. 7, the differentiator circuit has an input 71 connected to a node 72. Also connected to the node 72 are one side of three switches S71 to S73, the drain electrodes of two n-channel field effect transistors T71 and T72, and one end of a current source 73. The other end of the current source 73 is connected to a positive supply rail 74 while the source electrodes of transistors T71 and T72 are connected to a negative supply rail 75. The other side of the switch S71 is connected to the junction of the gate electrode of transistor T71 and a capacitor C71 whose other end is connected to the negative supply rail 75. The other side of switch S72 is connected to the junction of the gate electrode of transistor T72 and a capacitor C72 whose other end is connected to the negative supply rail 75. The gate electrode of transistor T72 is connected to the gate electrode of two further n-channel field effect transistors T73 and T74. The source electrode of transistor T73 is connected to the negative supply rail 75 while its drain electrode is connected to the other side of switch S73 and, via a current source 76, to the positive supply rail 74. The source electrode of transistor T74 is connected to the negative supply rail 75 while its drain electrode is connected to an output terminal 77 and, via a current source 78 to the positive supply rail 74.

In operation an input current i is applied to input 71 and an output current $i_o$ is produced at output 77. The current sources 73, 76, and 78 produce the currents 2j, Bj and Aj, respectively. The current mirror circuit formed by transistors T72, T73 and T74 has a current ratio of 1:B:A. Switches S72 and S73 are closed during portion $\phi 1$ of each sampling period while switch S71 is closed during portion $\phi 2$ of each sampling period.

The operation of the differentiator circuit shown in FIG. 7 can be analysed as follows. During the portion $\phi 2$ of sampling period (n−1), the current $I_1$ in transistor T71 is given by the relationship:

$$I_1 = 2j + i(n-1) - I_2$$
where: $I_2$ is the current through transistor T72
$$= 2j + i(n-1) - I_4/A$$
where: $I_4$ is the current through transistor T74
$$= 2j + i(n-1) - (AJ - i_o(n-1))/A$$
$$= j + i(n-1) + i_o(n-1)/A$$

During the portion $\phi 1$ of sampling period n, the current $I_2$ is given by the relationship:

$$I_2 = 2j + i(n) + B\, i_o(n)/A - I_1$$
$$= 2j + i(n) + B\, i_o(n)/A - (j + i(n-1) + i_o(n-1)/A)$$
$$= j + i(n) - i(n-1) + B\, i_o(n)/A - i_o(n-1)/A$$
$$i_o(n) = Aj - I_4 = A(j - I_2)$$
$$= Aj - A(j + i(n) - i(n-1) + B\, i_o(n)/A - i_o(n-1)/A$$
$$= -A(i(n) - i(n-1)) - B\, i_o(n) + i_o(n-1)$$

Transforming to the z domain $$i_o(z)(1 + B - z^{-1}) = -Ai(z)(1 - z^{-1}) \quad (2)$$

$$H(z) = \frac{-A(1 - z^{-1})}{1 + B - z^{-1}} = -\frac{A(1 - z^{-1})/(1 + B)}{1 - z^{-1}/(1 + B)}$$

A continuous time lossy differentiator may be formed by modifying the ideal integrator shown in FIG. 1 by connecting a further capacitor C1 between the input and output of the amplifier A. It can easily be shown that the transfer function of this lossy differentiator is given by:

$$H(s) = \frac{-C/C1}{1 + 1/sC1R} = \frac{-x}{1 + 1/s\tau}$$

Using the Backward Euler mapping $s \rightarrow (1 - z^{-1})/T$

Then $$H(z) = \frac{-x}{1 + T/(1 - z^{-1})} \quad (3)$$

where: $T$ is the sampling period $$= \frac{-x(1 - z^{-1})/(1 + T/\tau)}{1 - z^{-1}/(1 + T/\tau)}$$

where: $x = C/C1$ and $\tau = C1R$

Relationship (2) maps onto relationship (3) where:

$A = x$ and $B = T/\tau$.

Consequently it can be seen that the differentiator circuit shown in FIG. 7 is a lossy differentiator performing a Backward Euler mapping from the continuous time lossy differentiator.

If the Forward Euler mapping $s \rightarrow (1 - z^{-1})/Tz^{-1}$ is used then $$H(z) = x/(1 + Tz^{-1}/(1 - z^{-1})\tau) \quad (4)$$
$$= x(1 - z^{-1})/(1 - (1 - T/\tau)z^{-1})$$

Figure 8:
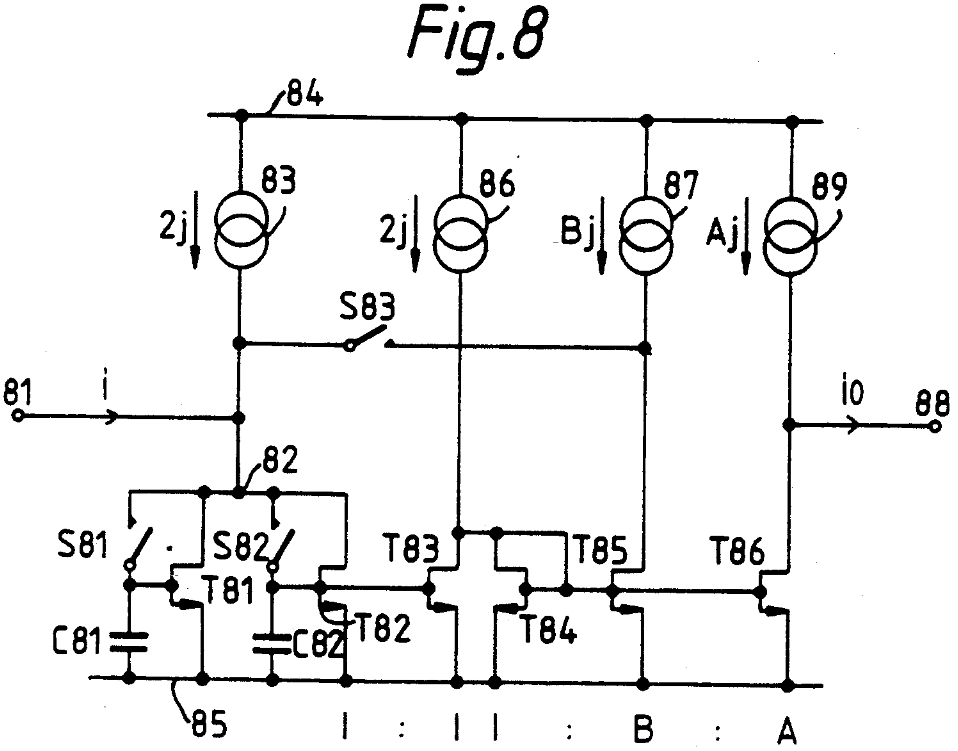
FIG. 8 is a circuit diagram of a sixth embodiment of a differentiator circuit according to the invention.

FIG. 8 shows a sixth embodiment of a differentiator circuit according to the invention in the form of a lossy differentiator performing a Forward Euler mapping from a continuous time lossy differentiator. As shown in FIG. 8, the differentiator circuit has an input 81 which is connected to a node 82. Also connected to the node 82 are three switches S81, S82 and S83, the drain electrodes of two n-channel field effect transistors T81 and T82, and one end of a current source 83 whose other end is connected to a positive supply rail 84. The other side of the switch S81 is connected to the junction of the gate electrode of transistor T81 and one end of a capacitor C81 whose other end is connected to a negative supply rail 85. The other side of the switch S82 is connected to the junction of the gate electrode of transistor T82 and to one end of a capacitor C82 whose other end is connected to the negative supply rail 85. The source electrodes of transistors T81 and T82 are connected to the negative supply rail 85. The gate electrode of transistor T82 is connected to the gate electrode of an n-channel field effect transistor T83 whose source electrode is connected to the negative supply rail 85 and whose drain electrode is connected to the positive supply rail 84 via a current source 86. The drain electrode of transistor T83 is connected to the drain and gate electrodes of an n-channel field effect transistor T84 whose source electrode is connected to the negative supply rail 85. The gate electrode of transistor T84 is connected to the gate electrodes of two further n-channel field effect transistors T85 and T86. The source electrode of transistor T85 is connected to the negative supply rail 85 while its drain electrode is connected to the other side of switch S83 and, via a current source 87 to the positive supply rail 84. The source electrode of transistor T86 is connected to the negative supply rail 85 while its drain electrode is connected to an output terminal 88 and, via a current source 89, to the positive supply rail 84.

In operation an input current i is applied to the input 81 and an output current $i_o$ is produced at the output 88. The current sources 83, 86, 87 and 89 produce the currents 2j, 2j, Bj, and Aj, respectively. The current mirror circuit formed by transistors T82 and T83 has a current ratio of 1:1 while the current mirror circuit formed by transistors T84, T85 and T86 has current ratios of 1:B:A. Switch S82 is closed during the portion $\phi 1$ of each sampling period while switches S81 and S83 are closed during the portion $\phi 2$ of each sampling period.

The operation of the circuit shown in FIG. 8 can be analysed as follows. During portion $\phi 2$ of sampling period (n−1), the current $I_1$ through transistor T81 is given by the relationship:

$$I_1=2j+i(n-1)+Bi_o(n-1)/A-I_2$$

where: $I_2$ is the current through transistor T82.

$$\begin{aligned}I_2 = I_3 = 2j - I_4 = 2j - I_6/A = 2j - (j - i_o(n-1)/A)\\ = j + i_0(n-1)/A\end{aligned}$$

where: $I_3$, $I_4$, etc. are the currents through transistors T83, T84, etc.

Therefore:

$$\begin{aligned}I_1 &= 2j + i(n-1) + Bi_o(n-1)/A - (j + i_o(n-1)/A)\\ &= j + i(n-1) - (1-B)i_o(n-1)/A\end{aligned}$$

During portion $\phi 1$ of sampling period n, the current $I_2$ is given by the relationship:

$$\begin{aligned}I_2 &= 2j + i(n) - I_1\\ &= 2j + i(n) - (j + i(n-1) - (1-B)i_o(n-1)/A)\\ i_o(n) &= A(I_2 - j)\\ &= A(i(n) - i(n-1) + (1-B)i_o(n-1)/A)\\ i_o(n) - (1-B)i_o(n-1) &= A(i(n) - i(n-1))\end{aligned}$$

Transforming to the z domain $$I_o(z)(1-(1-B)z^{-1}) = A\, i(z)(1-z^{-1}) \qquad (5)$$

$$H(z) = A\frac{1-z^{-1}}{1-(1-B)z^{-1}}$$

Equation (5) maps onto equation (4) where: $B=T/\tau$. Consequently it can be seen that the circuit shown in FIG. 8 forms a Forward Euler mapping of the continuous time lossy differentiator.

If the bilinear mapping $$s \rightarrow \frac{2}{T}\;\frac{1-z^{-1}}{1+z^{-1}}$$

of the continuous time lossy differentiator is used then mapping to the z domain from the continuous time relationship:

$$H(s) = \frac{-x}{1+1/s}$$

gives $$\begin{aligned}H(z) &= \frac{-x}{1+\frac{T}{2\tau}\cdot\frac{1+z^{-1}}{1-z^{-1}}} \qquad (6)\\ &= \frac{-x(1-z^{-1})}{1-z^{-1}+T(1+z^{-1})/2\tau}\\ &= \frac{-x(1-z^{-1})}{1+T/2\tau - z^{-1}(1-T/2\tau)}\\ &= \frac{-x(1-z^{-1})/(1+T/2\tau)}{1-z^{-1}(1-T/2\tau)/(1+T/2\tau)}\\ &= \frac{-x(1-z^{-1})(1+T/2\tau)}{1-\left(1-\frac{T/\tau}{1+T/2\tau}z^{-1}\right)}\end{aligned}$$

It can be seen that equation (6) maps onto equation (4) where:

$$x \rightarrow x(1+T/2\tau) \text{ and } T/\tau \rightarrow T/\tau/(1+T/2\tau).$$

Consequently the differentiator shown in FIG. 8 also performs a bilinear mapping from the lossy continuous time differentiator provided that the appropriate scaling factors are chosen for A and B.

Figure 9:
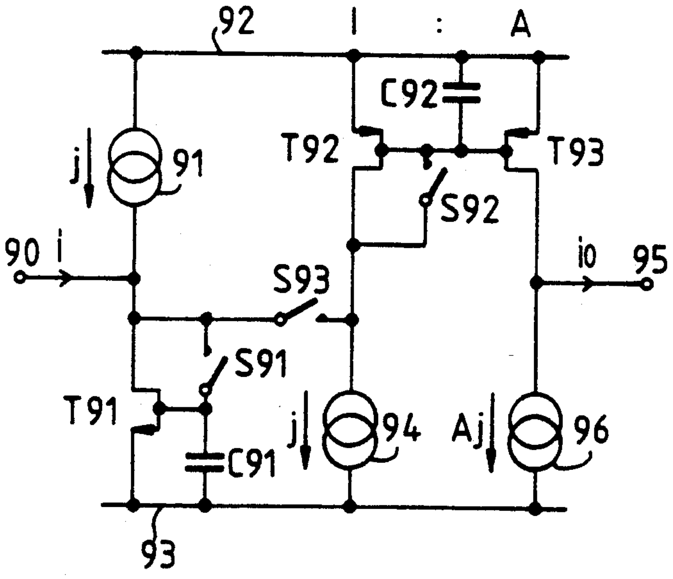
FIG. 9 is a circuit diagram of a seventh embodiment of a differentiator circuit according to the invention.

FIG. 9 shows a seventh embodiment of a differentiator circuit according to the invention having an input 90 which is connected to the junction of a current source 91 and the drain electrode of an n-channel field effect transistor T91. The other end of the current source 91 is connected to a positive supply rail 92 while the source electrode of transistor T91 is connected to a negative supply rail 93. A switch S91 is connected between the drain and gate electrodes of transistor T91 while a capacitor C91 is connected between its source and gate electrodes. A switch S93 is connected between the drain electrode of transistor T91 and the junction of a current source 94 and the drain electrode of a p-channel field effect transistor T92. The other end of the current source 94 is connected to the negative supply rail 93 while the source electrode of transistor T92 is connected to the positive supply rail 92. A switch S92 is connected between the gate and drain electrodes of transistor T92 while a capacitor C92 is connected between its gate and source electrodes. The gate electrode of transistor T92 is connected to the gate electrode of a p-channel field effect transistor T93 whose source electrode is connected to the positive supply rail 92 and whose drain electrode is connected to an output 95 and, via a current source 96 to the negative supply rail 93.

In operation an input signal i is applied to input 90 and an output current $i_o$ is produced at output 95. The current sources 91 and 94 produce a current j while the current source 96 produces a current Aj. The switch S91 is closed during portion $\phi$2 of each sampling period while the switches S92 and S93 are closed during portion $\phi$1 of each sampling period.

The operation of the circuit shown in FIG. 9 can be analysed as follows, where $I_1$, $I_2$ and $I_3$ are the currents through transistors T91, T92 and T93, respectively.

During portion $\phi$2 of sampling period n−1

$$I_1 = j + i(n-1)$$

During portion $\phi$1 of sampling period n $$\begin{aligned} I_2 &= j + I_1 - i(n) - j \\ &= -i(n) + j + i(n-1) \\ &= I_3/A \\ &= j + i_o(n)/A \\ i_o(n)/A &= -i(n) + i(n-1) \end{aligned}$$

Transforming to z domain $$i_o(z) = -A \cdot i(z)(1 - z^{-1})$$

$$H(z) = -A(1 - z^{-1})$$

As with the embodiment described with reference to FIG. 2, this corresponds to a Backward Euler mapping from the continuous time differentiator.

Clearly, the other forms of differentiator could also be formed using current memory cells of both polarities.

If the signal to be processed is a unidirectional current, it would be possible to dispense with the current sources 91, 94 and 96. For a current which always flows into input 90, the structure would be as shown with the deletion of the current sources while for a current which always flows out of input 90 the p-channel current memory cell would be connected to input 90 and the n-channel current memory cell would be connected to the output 95.

Figure 10:
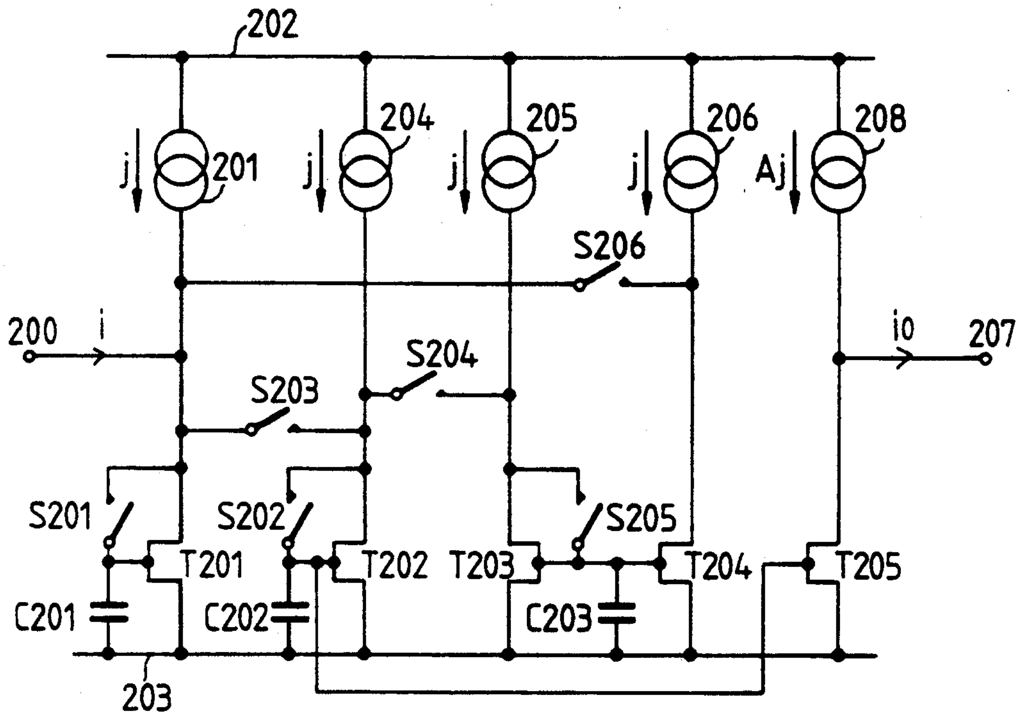
FIG. 10 is a circuit diagram of an eighth embodiment of a differentiator circuit according to the invention, and FIGS. 11 *a*) to *f*) show various alternative current memory cells which may be used in the differentiator circuits of FIG. 2 and FIGS. 4 to 10.

FIG. 10 is a circuit diagram of an eighth embodiment of a differentiator circuit according to the invention. The embodiment shown in FIG. 10 is an alternative form of bilinear ideal integrator. It comprises an input 200 which is fed to the junction of a current source 201 and the drain electrode of an n-channel field effect transistor T201. A switch S201 is connected between the drain and gate electrodes of transistor T201 while a capacitor C201 is connected between its gate and source electrodes. The other end of the current source 201 is connected to a positive supply rail 202 while the source electrode of transistor T201 is connected to a negative supply rail 203. The drain electrode of transistor T201 is connected via a switch S203 to the junction of a current source 204 and the drain electrode of an n-channel field effect transistor T202. The other end of the current source 204 is connected to the positive supply rail 202 while the source electrode of transistor T202 is connected to the negative supply rail 203. The drain electrode of transistor T202 is connected to its gate electrode via a switch S202 while a capacitor C202 is connected between its gate and source electrodes. The drain electrode of transistor T202 is connected via a switch S204 to the drain electrode of an n-channel field effect transistor T203 whose source electrode is connected to the negative supply rail 203. A switch S205 is connected between the gate and drain electrodes of transistor T203 while a capacitor C203 is connected between its gate and source electrodes. The gate electrode of transistor T203 is connected to the gate electrode of an n-channel field effect transistor T204 whose source electrode is connected to the negative supply rail 203. The drain electrode of transistor T204 is connected to the positive supply rail 202 via a current source 206 and via a switch S206 to the drain electrode of transistor T201. The drain electrode of transistor T203 is connected via a current source 205 to the positive supply rail 202. The gate electrode of transistor T202 is connected to the gate electrode of an n-channel field effect transistor T205 whose source electrode is connected to the negative supply rail 203. The drain electrode of transistor T205 is connected to an output 207 and via a current source 208 to the positive supply rail 202.

The current sources 201, 204, 205 and 206 are each arranged to produce a current j while the current source 208 is arranged to produce a current Aj. Transistors T203 and T204 are arranged to have the same channel width/length ratio so that when the switch S205 is closed the current mirror then formed has a 1:1 current ratio. The current mirror formed by transistors T202 and T205 is arranged to have a current ratio of 1:A. The switches S202 and S203 are arranged to be closed during the portion $\phi$1 of each sampling period while the switches S201, S204, S205 and S206 are arranged to be closed during the portion $\phi$2 of each sampling period. If it is assumed that the input current is i and the output current $i_o$ and that the currents through transistors T201, T202, T203, T204, T205 are $I_1$, $I_2$, $I_3$, $I_4$ and $I_5$ respectively, the operation of the circuit shown in FIG. 10 can be analysed as follows.

During the portion $\phi$2 of period (n−1)

$$I_1 = j + i(n-1) + (j - I_4)$$

and $$I_4 = I_3 = 2j - I_2 = \frac{2j - I_5}{A} = 2j - \frac{1}{A}(Aj - i_o(n-1)) = j + \frac{i_o(n-1)}{A}$$

Therefore $$I_1 = 2j + i(n-1) - \left(j + \frac{i_o(n-1)}{A}\right) = j + i(n-1) - \frac{i_o(n-1)}{A}$$

During the portion $\phi 1$ of period n the current through transistor T2 is given by $$I_2 = 2j + i(n) - I_1$$

$$= 2j + i(n) - \left(j + i(n-1) - \frac{i_o(n-1)}{A}\right)$$

$$= j + i(n) - i(n-1) + \frac{i_o(n-1)}{A}$$

and $$I_2 = \frac{I_5}{A} = Aj - \frac{i_o(n)}{A} = j - \frac{i_o(n)}{A}$$

Therefore $$j + i(n) - i(n-1) + \frac{i_o(n-1)}{A} = j - \frac{i_o(n)}{A}$$

Therefore $$i(n) - i(n-1) = -\frac{1}{A}\left(i_o(n) + i_o(n-1)\right)$$

Transforming to the z domain;

$$i(z)(1 - z^{-1}) = -\frac{1}{A}\, i_o(z)(1 + z^{-1})$$

Therefore $$H(z) = -A\,\frac{(1 - z^{-1})}{1 + z^{-1}}$$

It will be seen that this is the expression for the bilinear mapping of the continuous time differentiator where the differentiator is ideal and inverting.

The current memory cells in any of the embodiments could be replaced by any other current memory cells. Examples of such current memory cells are shown in FIG. 11.

Figure 11A:
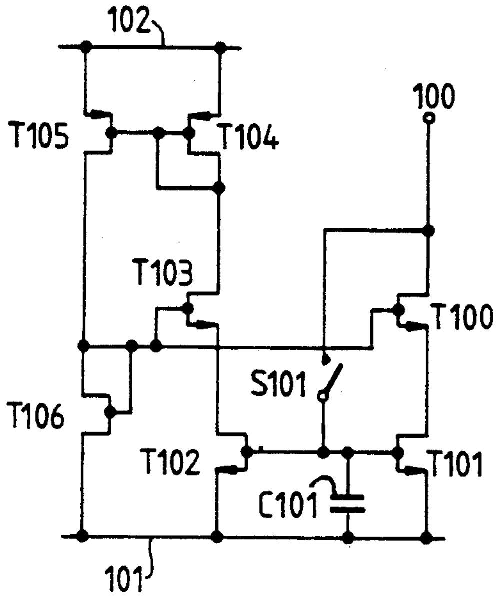

FIG. 11*a*) shows a current memory cell which is similar in form to that in FIGS. 1 to 10 but which includes a cascoded transistor to increase the output impedance of the current memory cell. It comprises a terminal 100 which is connected to the drain electrode of an n-channel field effect transistor T100 and to one side of a switch S101. The source electrode of transistor T100 is connected to the drain electrode of an n-channel field effect transistor T101 whose source electrode is connected to a negative supply rail 101. The other side of the switch S101 is connected to the gate electrode of transistor T101, to the gate electrode of an n-channel field effect transistor T102, and to one end of a capacitor C101 whose other end is connected to the negative supply rail 101. The source electrode of transistor T102 is connected to the negative supply rail 101 while its drain electrode is connected to the source electrode of an n-channel field effect transistor T103. The drain electrode of transistor T103 is connected to the drain and gate electrodes of a p-channel field effect transistor T104 whose source electrode is connected to a positive supply rail 102. The gate electrode of transistor T104 is connected to the gate electrode of a p-channel field effect transistor T105 whose source electrode is connected to the positive supply rail 102 and whose drain electrode is connected to the drain and gate electrodes of an n-channel field effect transistor T106. The source electrode of transistor T106 is connected to the negative supply rail 101 while its gate electrode is connected to the gate electrodes of transistors T100 and T103.

The current memory cell shown in FIG. 11*a*) operates as follows. When switch S101 is closed, the current applied to input 100 is sensed and the capacitor C101 is charged to the gate-source potential of transistor T101. The current in transistor T101 is mirrored in transistor T102 which together with transistors T103 to T106 forms a bias voltage generator for producing a bias voltage for application to the gate electrode of transistor T100. When switch S101 opens, transistors T101 acts as a current source and produces a current equal to that applied when switch S101 was closed since the gate-source potential remains the same as it is stored in the capacitor C101. The currents in the bias voltage generator will also be maintained for the same reason. The capacitor C101 may be the inherent gate-source capacitance of the transistor or may be augmented by a specially formed capacitor. For a description of the operation of the bias voltage generator reference should be made to U.S. Pat. No. 4,897,596 (Jan. 30, 1990). Thus terminal 100 forms the input of the current memory cell when switch S101 is closed and the output of the current memory cell when the switch S101 is open. Further outputs may be provided by mirroring the current in transistor T101.

Figure 11B:
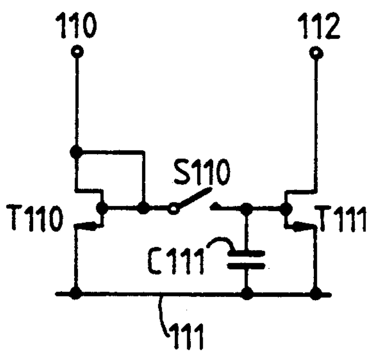

FIG. 11*b*) shows a current memory cell having an input 110 which is connected to the drain and gate electrodes of an n-channel field effect transistor T110. The source electrode of transistor T110 is connected to a negative supply rail 111 while its gate electrode is connected via a switch S110 to the gate electrode of an n-channel field effect transistor T111. The drain electrode of transistor T111 is connected to an output 112 while its source electrode is connected to the negative supply rail 111. A capacitor C111 is connected between the gate and source electrodes of transistor T111.

In operation an input current is fed to input 110 and when switch S110 is closed the circuit acts as a conventional current mirror circuit with an output current produced at output 112 which is proportional to the input current, the constant of proportionality being dependent on the relative dimensions of transistors T110 and T111. At the same time the capacitor C111, which may be the inherent gate-source capacitance of transistor T111 or may be augmented by a separately formed capacitor, is charged to the gate-source potential of transistor T111. When the switch S111 is opened the charge on capacitor C111 will maintain the gate-source potential of transistor T111 and consequently cause the current through the transistor T111 to be maintained a the same value as that when the switch was closed. Clearly, multiple outputs can be obtained by mirroring the current in transistor T111.

Figure 11C:
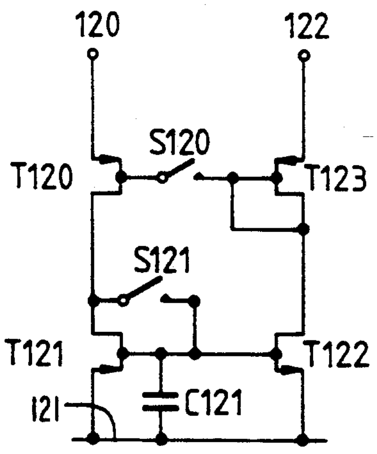

FIG. 11*c*) shows a current memory cell having an input 120 which is connected to the source electrode of a p-channel field effect transistor T120 whose drain electrode is connected to the drain electrode of an n-channel field effect transistor T121. The source electrode of transistor T121 is connected to a negative supply rail 121 while its gate electrode is connected to the gate electrode of a further n-channel field effect transistor T122. The drain electrode of transistor T121 is connected to its gate electrode via a switch S121. A capacitor C121 is connected between the source and gate electrodes of transistor T121. The source electrode of transistor T122 is connected to the negative supply rail 121 while its drain electrode is connected to the drain and gate electrodes of a p-channel field effect transistor T123. The source electrode of transistor T123 is connected to a terminal 122 while its gate electrode is connected to the gate electrode of transistor T120 via a switch S120.

It will be seen that the structure of the current memory cell shown in FIG. 11*c*) is similar to that of a current conveyor. It is modified by the provision of switches S120 and S121 and of capacitor C121. Further terminal 120 acts as an x-input when switches S120 and S121 are closed and a z-output when switches S120 and S121 are open. In operation a bias voltage is applied to terminal 122 which acts as a y-input of a current conveyor when the switches S120 and S121 are closed causing the potential at input 120, to which the current to be stored is applied, to be equal to the bias voltage. As is known in current conveyors, the input impedance at terminal 120 is very low and thus the summation of currents at terminal 120 is facilitated. While switch S121 is closed the capacitor C121, which may be formed merely by the gate-source capacitance of transistors T121 and T122 or may include an additional capacitor, becomes charged to the gate-source potential of transistor T121. Thus, when switches S120 and S121 open, transistor T121 acts as a current source whose current output depends on the value of the charge on capacitor C121. If desired, further current outputs may be provided by mirroring the current in transistor T121, the further current outputs being scaled by any desired factors which will be dependent on the transistor dimensions.

Figure 11D:
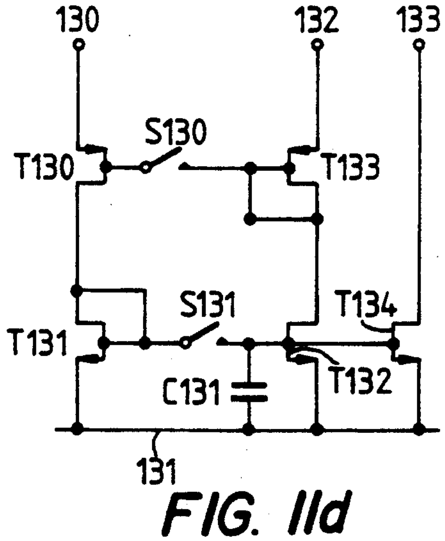

FIG. 11*d*) shows a further current memory cell which has an input 130 connected to the source electrode of a p-channel field effect transistor T130. The drain electrode of transistor T130 is connected to the drain and gate electrodes of an n-channel field effect transistor T131 whose source electrode is connected to a negative supply rail 131. The gate electrode of transistor T131 is connected, via a switch S131, to the gate electrode of an n-channel field effect transistor T132 whose source electrode is connected to the negative supply rail 131. A capacitor C131 is connected between the gate and source electrodes of transistor T132. The drain electrode of transistor T132 is connected to the drain and gate electrodes of a p-channel field effect transistor T133 whose source electrode is connected to a terminal 132. The gate electrode of transistor T133 is connected, via a switch S130, to the gate electrode of transistor T130. The gate electrode of transistor T132 is connected to the gate electrode of an n-channel field effect transistor T134 whose source electrode is connected to the negative supply rail 131 and whose drain electrode is connected to a terminal 133.

The current memory cell of FIG. 11*d*) can be seen to be similar in form to a current conveyor with terminal 130 forming the x-input, terminal 132 the y-input and terminal 133 the z-output. Thus, with switches S130 and S131 closed, the circuit would perform in the same manner as a current conveyor. However, as capacitor C131 becomes charged to the gate-source potential of transitor T132, when an input current is applied to input 130 the opening of switch 131 merely isolates transistor T132 from the input and that transistor and transistor T134 which is connected to output 133 continue to produce the same current as was produced when the switch S131 was closed. It should be noted that the actual current produced at output 133 depends on the accuracy of matching of transistors T131 and T134 whereas in the circuit shown in FIG. 10*c* the same transistor is used to monitor the input current and produce the output current thus reducing the problems associated with device matching and increasing the accuracy of the output current. However, in this case, there can be no scaling of the currents except by mirroring the current in the transistor T121 so that matching requirements are again involved. Consequently, if only a scaled current is required, then the circuit of FIG. 10*d* is equally suitable.

Figure 11E:
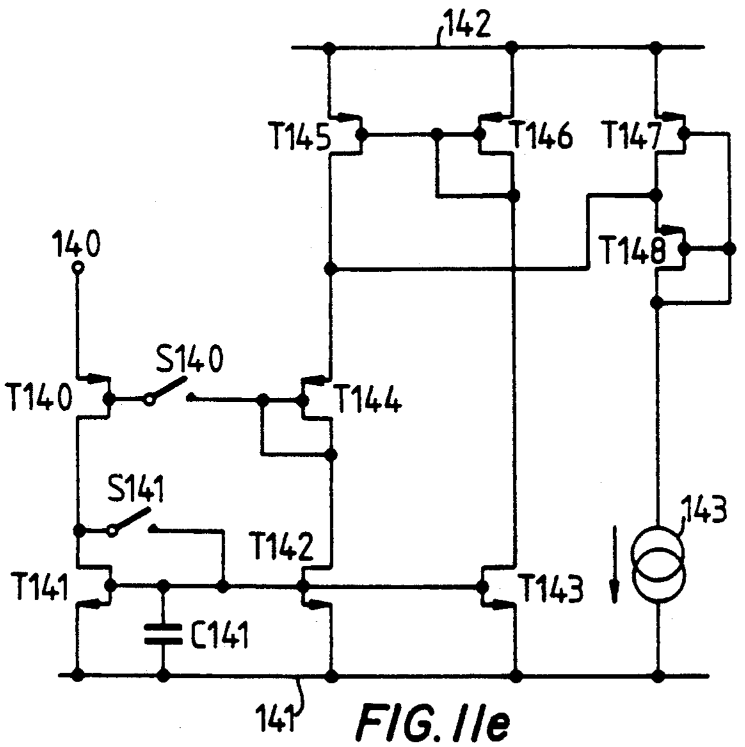

FIG. 11*e*) shows a further current memory cell having an input 140 which is connected to the source electrode of a p-channel field effect transistor T140. The drain electrode of transistor T140 is connected to the drain electrode of an n-channel field effect transistor T141 whose source electrode is connected to a negative supply rail 141. A switch S141 is connected between the drain and gate electrodes of transistor T141 while a capacitor C141 is connected between its gate and source electrodes. The gate electrode of transistor T141 is connected to the gate electrodes of two further n-channel field effect transistors T142 and T143 whose source electrodes are connected to the negative supply rail 141. The drain electrode of transistor T142 is connected to the drain and gate electrodes of a p-channel field effect transistor T144 whose source electrode is connected to the drain electrode of a p-channel field effect transistor T145. The drain electrode of transistor T143 is connected to the drain and gate electrodes of a p-channel field effect transistor T146 whose source electrode is connected to a positive supply rail 142. A p-channel field effect transistor T147 has its source electrode connected to the positive supply rail 142 and its drain electrode connected to the source electrode of a p-channel field effect transistor T148. The drain electrode of transistor T148 is connected to the gate electrodes of transistors T147 and T148 and, via a current source 143, to the negative supply rail 141. The source electrode of transistor T145 is connected to the positive supply rail 142 while its drain electrode is connected to the junction of the drain electrode of transistor T147 and the source electrode of transistor T148.

With the switches S141 and S140 closed and if an output branch mirrored from transistor T142 is provided, the circuit shown in FIG. 11*e* is the same as the Class II current conveyor disclosed in U.S. Pat. No. 5,055,719 (Oct. 8, 1991) to which reference should be made for a detailed explanation of its operation and characteristics. As with the circuit shown in FIG. 11*c*, when switches S140 and S141 are open transistor T141 acts as a current source reproducing the current which was fed to terminal 140 when the switches S140 and S141 were closed.

Figure 11F:
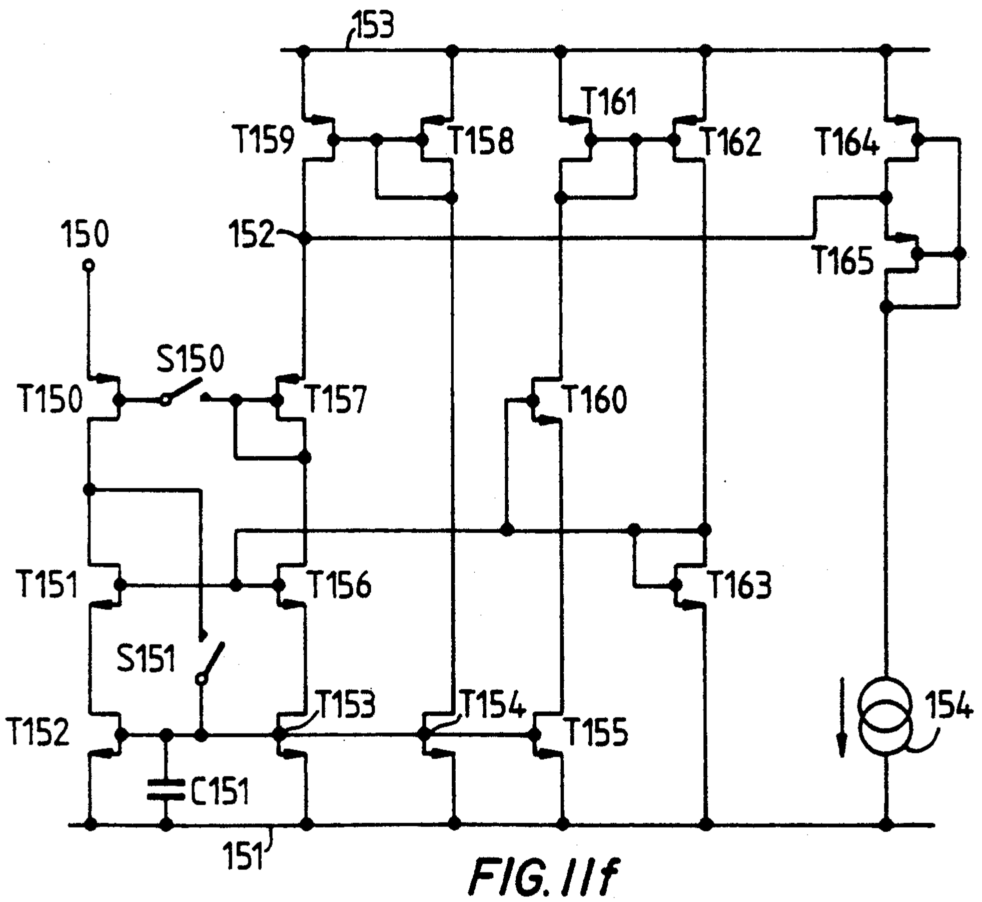

FIG. 11*f*) shows a further current memory cell having a terminal 150 connected to the source electrode of a p-channel field effect transistor T150. The drain electrode of transistor T150 is connected to the drain electrode of an n-channel field effect transistor T151 whose source electrode is connected to the drain electrode of an n-channel field effect transistor T152. The drain electrode of transistor T151 is connected to the gate electrode of transistor T152 via a switch S151. The source electrode of transistor T152 is connected to a negative supply rail 151 while a capacitor C151 is connected between its gate and source electrodes. The gate electrode of transistor T152 is connected to the gate electrodes of three further n-channel field effect transistors T153, T154 and T155 whose source electrodes are connected to the negative supply rail 151. The drain electrode of transistor T153 is connected to the source electrode of an n-channel field effect transistor T156 whose drain electrode is connected to the drain and gate electrodes of a p-channel field effect transistor T157. The gate electrode of transistor T157 is connected to the gate electrode of transistor T150 via a switch S150 while its source electrode is connected to a node 152. The gate electrode of transistor T151 is connected to the gate electrode of transistor T156.

The drain electrode of transistor T154 is connected to the drain and gate electrodes of a p-channel field effect transistor T158 whose source electrode is connected to a positive supply rail 153. The gate electrode of transistor T158 is connected to the gate electrode of a p-channel field effect transistor T159 whose source electrode is connected to the positive supply rail 153 and whose drain electrode is connected to the node 152.

The drain electrode of transistor T155 is connected to the source electrode of an n-channel field effect transistor T160 whose drain electrode is connected to the drain and gate electrodes of a p-channel field effect transistor T161. The source electrode of transistor T161 is connected to the positive supply rail 153 while its gate electrode is connected to the gate electrode of a p-channel field effect transistor T162 whose source electrode is connected to the positive supply rail 153. The drain electrode of transistor T162 is connected to the drain and gate electrodes of a n-channel field effect transistor T163 whose source electrode is connected to the negative supply rail 151. The gate electrode of transistor T163 is connected to the gate electrodes of transistors T151, T156 and T160.

A p-channel field effect transistor T164 has its source electrode connected to the positive supply rail 153 and its drain electrode connected to the source electrode of a further p-channel field effect transistor T165. The gate electrode of transistor T165 is connected to its drain electrode and to the gate electrode of transistor T164. The drain electrode of transistor T165 is connected via a current source 154 to the negative supply rail 151. The junction of the drain electrode of transistor T164 and the source electrode of transistor T165 is connected to the node 152.

It can be seen that the current memory cell shown in FIG. 11*f*) is similar to that shown in FIG. 11*e*) but has, in addition to the Class II current conveyor structure, cascode connected transistors in the lower current mirror circuit and suitable bias voltage generating means for the cascode connected transistors.

Clearly, other forms of current memory cell could be used in the differentiator circuits shown, the only requirement being that the circuit sense a current in one sampling period or a portion thereof and reproduce a current dependent on the sensed current at a later time. For example, the current memory cells shown in FIGS. 11*a*) and *b*) could be constructed using p-channel devices rather than the n-channel device shown and the current conveyor structures could be of a opposite polarity. Current memory cells using both polarity devices can be combined to form the differentiator circuits instead of using current memory cells of one polarity only.

From reading the present disclosure, other modifications will be apparent to persons skilled in the art. Such modifications may involve other features which are already known in the design and use of electrical or electronic circuits and component parts thereof and which may be used instead of or in addition to features already described herein. Although claims have been formulated in this application to particular combinations of features, it should be understood that the scope of the disclosure of the present application also includes any novel feature or any novel combination of features disclosed herein either explicitly or implicitly or any variation of one or more of those features which would be obvious to persons skilled in the art, whether or not it relates to the same invention as presently claimed in any claim and whether or not it mitigates any or all of the same technical problems as does the present invention.

I claim:

1. A differentiator circuit for differentiating an input signal in the form of a sampled analog current, comprising: first and second current memory cells each having an input for receiving a current to be stored and an output for reproducing the stored current, means for applying a current which comprises the input signal minus the output current of the second current memory cell to the input of the first current memory cell during one portion of each sampling period, means for applying the input signal to the input of the second current memory cell during another portion of each sampling period, and means for deriving a differentiated output signal from the output of the first current memory cell.

2. A differentiator circuit as claimed in claim 1 for differentiating signals which comprise bi-directional currents comprising: means for adding bias current to the input signal current to enable a unidirectional current to be applied to the inputs of the first and second current memory cells, and means for subtracting a bias current from the output of the second current memory cell during the one portion of a sampling period for application to the input of the first current memory cell wherein the means for deriving the differentiated output signal comprises means for subtracting an appropriately scaled bias current from an output current produced by the first current memory cell.

3. A differentiator circuit as claimed in claim 2, comprising means for subtracting a current proportional to the differentiator output current from the input signal applied to at least one of the first and second current memory cells.

4. A differentiator circuit as claimed in claim 3, in which the current proportional to the differentiator output current is subtracted from the input signal only during the one portion of each sampling period.

5. A differentiator circuit as claimed in claim 4 wherein the current proportional to the differentiator output current is inverted with respect to the differentiator output current.

6. A differentiator circuit as claimed in claim 3 wherein the current proportional to the differentiator output current is inverted with respect to the differentiator output current.

7. A differentiator circuit as claimed in claim 2 wherein the current memory cells each comprise sensing means for sensing an input current, storage means for storing the input current and reproducing means for reproducing the input current, and wherein the sensing and reproducing means comprise a single device coupled to the storage means.

8. A differentiator circuit as claimed in claim 7, in which the current memory cells comprise a field effect transistor having a gate-source capacitance and a switch connected between its gate and drain electrodes, the field effect transistor acting as the sensing means when the switch is closed and the reproducing means when the switch is open, wherein the storage means comprises the gate-source capacitance of the field effect transistor.

9. A differentiator circuit as claimed in claim 8, wherein a further capacitor is connected between the gate and source electrodes of the transistor.

10. A differentiator circuit as claimed in claim 8, wherein the first and at least one of second current memory cells comprises a second cascode connected field effect transistor connected between the drain electrode of the first transistor and the switch.

11. A differentiator circuit as claimed in claim 2 wherein the second current memory cell comprises a plurality of outputs each producing a current dependent on the current stored.

12. A differentiator circuit as claimed in claim 11 wherein the second current memory cell coupled to a current inversion means enabling an inverted current having a magnitude proportional to the stored current to be produced at one or more outputs.

13. A differentiator circuit as claimed in claim 1, comprising means for subtracting a current proportional to the differentiator output current from the input signal applied to at least one of the first and second current memory cells.

14. A differentiator circuit as claimed in claim 13 wherein the current proportional to the differentiator output current is inverted with respect to the differentiator output current.

15. A differentiator circuit as claimed in claim 12, in which the current proportional to the differentiator output current is subtracted from the input signal only during the one portion of each sampling period.

16. A differentiator circuit as claimed in claim 1 wherein the current memory cells comprise sensing means for sensing an input current, storage means for storing the input current and reproducing means for reproducing the input current, and wherein the sensing and reproducing mans comprise a single device coupled to the storage means.

17. A differentiator circuit as claimed in claim 16, in which the current memory cells comprise a field effect transistor having a gate-source capacitance and a switch connected between its gate and drain electrodes, the field effect transistor acting as the sensing means when the switch is closed and the reproducing means when the switch is open, wherein the storage means comprises the gate-source capacitance of the field effect transistor.

18. A differentiator circuit as claimed in claim 17, at least one of the first and second current memory cells comprises a second cascode connected field effect transistor connected between the drain electrode of the first transistor and the switch.

19. A differentiator circuit as claimed in claim 1 wherein the second current memory cell comprises a plurality of outputs each producing a current dependent on the current stored.

20. A differentiator circuit as claimed in claim 1 wherein said first and second current memory cells each comprise a field effect transistor, a capacitor coupled between a gate electrode and one main electrode of its respective field effect transistor and a switch coupled to the respective field effect transistor, where the switch of the first current memory cell and the switch of the second current memory cell are closed in mutually exclusive time intervals, and wherein the field effect transistor of the second current memory cell is operative as a current source during the interval when its respective switch is open.

21. A differentiator circuit for a sampled analog current received at an input terminal comprising:

a first current memory cell having energy storage means, an input for receiving a current to be stored and an output for reproducing the stored current, a second current memory cell having energy storage means, an input for receiving a current to be stored and an output for reproducing the stored current, first switching means for applying a current which comprises the input current minus an output current of the second current memory cell to the input of the first current memory cell during a first part of each sampling period, second switching means for applying the input current to the input of the second current memory cell during a second part of each sampling period, and means coupled to the first current memory cell for deriving a differentiated output current dependent on a current stored by the first current memory cell.

22. A differentiator circuit as claimed in claim 21 wherein said first and second current memory cells comprise first and second field effect transistors, respectively, wherein the energy storage means of each current memory cell comprises a capacitor coupled between a gate electrode and a first main electrode of the respective field effect transistor, wherein said first switching means includes a first switch coupled between the gate electrode and a second main electrode of the first field effect transistor, and said second switching means includes a second switch coupled between the gate electrode and a second main electrode of the second field effect transistor.

23. A differentiator circuit as claimed in claim 22 further comprising a third switch coupled between said input terminal and said second main electrode of the first field effect transistor.

24. A differentiator circuit as claimed in claim 23 wherein said input terminal is connected to the second main electrode of the second field effect transistor, and wherein said first memory cell further comprises a third field effect transistor connected to form a current mirror with said first field effect transistor and having one main electrode connected to an output terminal which supplies said differentiated output current.

25. A differentiator circuit as claimed in claim 21 further comprising:

means coupled to said first and second current memory cells for adding a bias current to the input current, and a current source coupled to the first current memory cell for subtracting a scaled bias current from said output current.

* * * * *

UNITED STATES PATENT AND TRADEMARK OFFICE

CERTIFICATE OF CORRECTION

PATENT NO. : 5,179,301

DATED : January 12, 1993

INVENTOR(S) : John B. Hughes

It is certified that error appears in the above-indentified patent and that said Letters Patent is hereby corrected as shown below:

Column 1, line 6, insert as a centered heading: --BACKGROUND OF THE INVENTION--.

Column 21, claim 15, line 31, change "12" to --13--.

Signed and Sealed this

Fifth Day of April, 1994

Attest:

BRUCE LEHMAN

Attesting Officer

Commissioner of Patents and Trademarks